(12) United States Patent
Chang et al.

(10) Patent No.: US 6,723,649 B2
(45) Date of Patent: Apr. 20, 2004

(54) METHOD OF FABRICATING A SEMICONDUCTOR MEMORY DEVICE

(75) Inventors: Tsai-Fu Chang, Taichung (TW); Shih-Lin Chu, Kaohsiung (TW); Ching-Pen Yeh, Hsinchu (TW)

(73) Assignee: Macronix International Co., Taiwan (TW)

( * ) Notice: Subject to any disclaimer, the term of this patent is extended or adjusted under 35 U.S.C. 154(b) by 111 days.

(21) Appl. No.: 10/157,819

(22) Filed: May 31, 2002

(65) Prior Publication Data

US 2003/0141278 A1 Jul. 31, 2003

(30) Foreign Application Priority Data

Jan. 31, 2002 (TW) ........................ 91101645 A

(51) Int. Cl.$^7$ ............................. H01L 21/302
(52) U.S. Cl. .............. 438/694; 438/275; 438/278; 438/525; 438/705
(58) Field of Search ............... 438/275, 276, 438/277, 278, 262, 525, 705, 694

(56) References Cited

U.S. PATENT DOCUMENTS 6,077,746 A * 6/2000 You et al. .................. 438/276
6,248,635 B1 * 6/2001 Foote et al. ............... 438/287

* cited by examiner

Primary Examiner—George A. Goudreau
(74) Attorney, Agent, or Firm—Birch, Stewart, Kolasch & Birch, LLP

(57) ABSTRACT

A method of fabricating a semiconductor memory device, particularly a mask ROM. A sacrificial oxide layer is formed on a silicon substrate and then a photoresist layer is formed on the sacrificial oxide layer. The photoresist layer is patterned to form a plurality of openings where bit lines are to extend respectively. Taking the patterned photoresist layer as a mask, arsenic ions are implanted into the silicon substrate through the openings and then boron ions are implanted into the silicon substrate through the openings. The implantation depth of boron ions are deeper than arsenic ions. The photoresist layer and the sacrificial oxide layer are removed after implantation. A gate oxide and a field oxide are grown simultaneously on the non-implanted and the implanted regions of the semiconductor layers respectively and a gate conductive layer is deposited on the silicon substrate.

15 Claims, 8 Drawing Sheets

METHOD OF FABRICATING A SEMICONDUCTOR MEMORY DEVICE

BACKGROUND OF THE INVENTION

1. Field of the Invention

The present invention relates to a semiconductor memory device, and more particularly to a method of fabricating a mask read-only memory (ROM).

2. Description of the Related Art

Mask ROM (Read Only Memory) is one of the non-volatile memories that retain data even when electric power is off. The MOS transistor array in mask ROM is defined by a photomask during fabrication and the data is programmed according to the photomask pattern. After the data is written in mask ROM, it is neither erasable nor programmable, which makes mask ROM a high capacity, high reliability and low cost memory device applied in various kinds of information, communication or consumption products to store critical data.

Mask ROM can be classified into NAND-type ROM and NOR-type ROM. It is considered that NOR-type ROM is superior in terms of operation speed. A conventional method of NOR-type ROM fabrication is disclosed in U.S. Pat. No. 5,911,106 by Tasaka Kazuhiro. The fabrication process of a NOR-type mask ROM is shown on FIG. 1 and FIGS. 2A to 2D. FIG. 1 is the top view of an array configuration of memory cells of the NOR-type mask ROM. Bit lines 6 of diffusion regions of an N conductivity type formed in a silicon substrate of a P conductivity type extend in a vertical direction, and word lines 8 are disposed above and extend orthogonal to the direction of the bit lines 6. The word lines 8 are made of a polycide structure that is a laminate structure of a lower polycrystalline silicon layer and an upper slicide layer. Below each of the word lines 8 and between the adjacent two bit lines 6 is formed a channel of a memory cell transistor.

FIGS. 2A to 2D show the fabrication process of the flat NOR-type mask ROM. In FIG. 2A, the surface of a silicon substrate 1 of P conductivity type is subjected to oxidation to grow oxides to form a pad oxide film 2 and a silicon nitride film 3 is deposited on the film 2. The silicon nitride film 3 acts as an oxidation resisting film. A resist (photoresist) 4 is formed on the silicon nitride film 3. The resist 4 has openings where diffusion regions of N conductivity, which act as bit lines, are to extend.

The silicon nitride film 3 is selectively removed, as shown in FIG. 2B, by anisotropic etching technique with the resist 4 as a mask. Using the resist 4 as a mask, ion implantation is performed vertically, which means the implantation angle is 0°, to introduce dopants of N conductivity type, such as arsenic (As), into the substrate 1 to form N-type dopant implanted portions below the openings.

In FIG. 2C, still using the resist 4 as a mask, ion implantation is performed vertically with the implantation angle 0° to introduce dopants of P conductivity type, such as boron (B), into the substrate 1 to form P-type dopant implanted portions below the openings. The implantation energy of P-type ions is greater than the N-type ion implantation, and therefore the P-type dopant implanted portions are formed right below the N-type dopant implanted portions.

In FIG. 2D, after the resist 4 has been removed, selective oxidation is performed with the silicon nitride film 3 as a mask. In the selective oxidation, the implanted dopant atoms are diffused to form dopant diffusion regions 6 of N conductivity and regions 10 of P conductivity and field oxide regions 5 are formed on the dopant diffusion regions 6. These dopant diffusion regions 6 act as bit lines.

In FIG. 2E, after removing the silicon nitride film 3 and pad oxide film 2 to expose surface portions of the silicon substrate 1, gate oxide regions 7 are formed on the exposed surface portions of the silicon substrate 1. Subsequently, a laminated structure of a lower polycrystalline silicon film and an upper tungsten silicide (WSi) film are deposited over the whole surface of the assembly, and patterned to define word lines 8. Formed below each of the word lines 8 and between the adjacent two of the N conductivity-type diffusion regions 6 (bit lines) is a channel 9.

In the conventional fabrication process describing above, the silicon nitride film 3 is formed as a mask of oxidation to prevent the active areas defined in the silicon substrate 1 from being oxidized. Therefore, an additional step is needed to remove the silicon nitride film 3 after oxidation.

Moreover, in the conventional fabrication process described above, the field oxide 5 is first formed with the silicon nitride film 3 as a mask during oxidation. After the field oxide 5 is formed, the silicon nitride film 3 is then removed, and the gate oxide 7 is formed by another oxidation subsequently. It takes at least three steps to complete the fabrication of field oxide 5 and gate oxide 7.

SUMMARY OF THE INVENTION

To simplify the fabrication of mask ROMs, one object of the present invention is to provide a method for fabricating a mask ROM without a silicon nitride film as a mask.

Another object of the present invention is to provide a method for fabricating a mask ROM which provides a pad oxide film or a pad oxide/bottom anti-reflection layer as a mask during oxidation to reduce the number of fabrication steps.

To achieve the above-mentioned objects, a method for fabricating a semiconductor memory device, such as a mask ROM, comprises the following steps.

First, a sacrificial oxide layer is formed on a semiconductor substrate and then a photoresist layer is formed on the sacrificial oxide layer. Second, the photoresist layer is patterned to form a plurality of openings where bit lines are to extend respectively. Taking the patterned photoresist layer as a mask, first type ions are implanted into the semiconductor substrate through the openings and then second type ions are implanted into the semiconductor substrate through the openings. The first type ions and the second type ions are electrically opposite and the implantation depth of the second type ions are deeper than the first type ions. The photoresist layer and the sacrificial oxide layer are removed after implantation. A gate oxide and a field oxide are grown simultaneously on the non-implanted and the implanted regions of the semiconductor layers respectively and a gate conductive layer is deposited on the semiconductor substrate.

Further, in a preferred embodiment, a bottom anti-reflective coating (BARC) is deposited between the sacrificial oxide layer and the photoresist layer to reduce multiple reflection and interference in photo-lithography. The sacrificial oxide layer can be silicon oxide as a pad oxide. The first type ions can be N-type, such as arsenic ion (As$^+$), and the second type ions can be P-type, such as boron (B). The second type ions can be implanted at a 0 degree (0°) angle or implanted at an angle greater than 0°, which means a pocket implantation, into the semiconductor substrate. The gate conductive layer can be a poly-silicon material.

According to the invention, the fabrication process of a mask ROM is simplified and there is no need to form a silicon nitride layer as a mask. Therefore, the step of removing silicon nitride layer is not required. Moreover, the gate oxide and the field oxide are formed simultaneously in an oxidation process according to the present invention. The advantage of the method of fabricating a mask ROM in the invention is simplifying the fabrication process and therefore reduces the cost of fabrication and fabrication time.

BRIEF DESCRIPTION OF THE DRAWINGS

The present invention will become more fully understood from the detailed description given herein below and the accompanying drawings, given by way of illustration only and thus not intended to be limitative of the present invention.

In the drawings:

FIGS. 2A to 2E are cross-sectional views of the mask ROM taken during successive steps in conventional fabrication process, wherein FIGS. 2A to 2E are cross-sectional views taken through the line 4-4' in FIG. 1;

FIGS. 4A to 4E are cross-sectional views of the mask ROM taken during successive steps in fabrication process according to one embodiment in the present invention, wherein FIGS. 4A to 4E are cross-sectional views taken through the line 4-4' in FIG. 3.

DETAILED DESCRIPTION OF THE INVENTION

Figure 1:
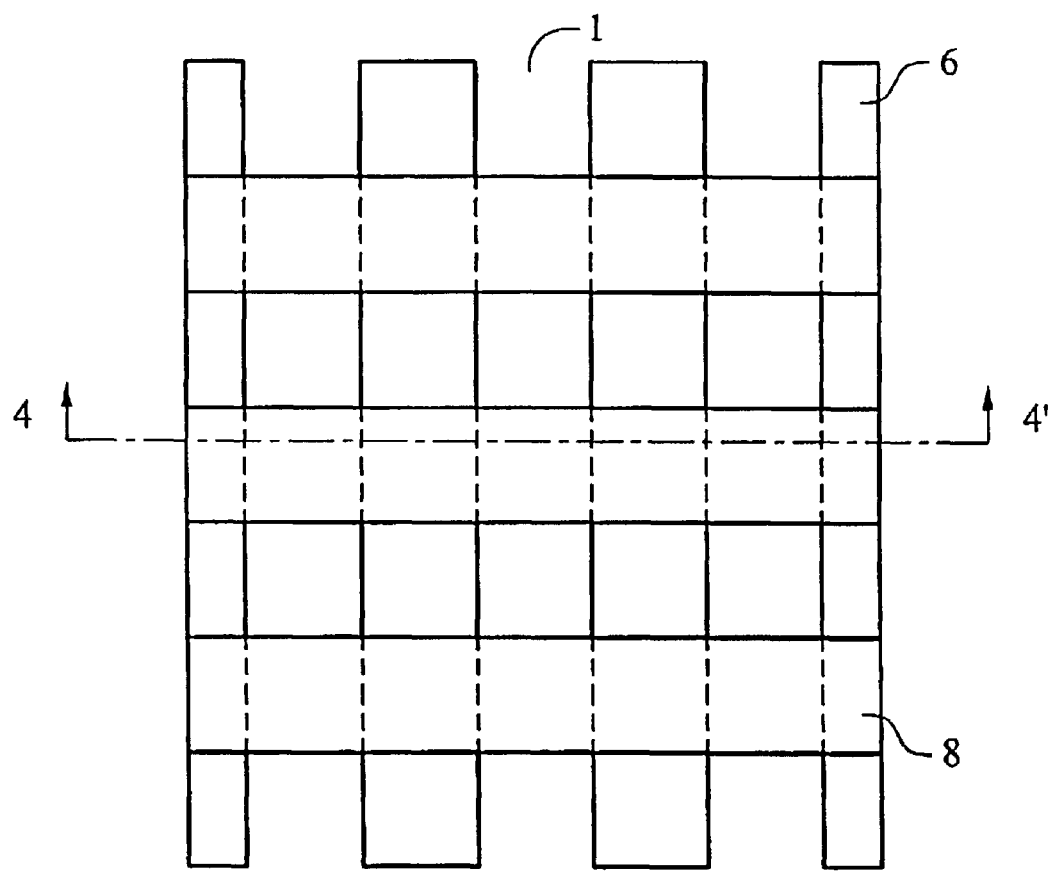
FIG. 1 is a top view of a conventional NOR type mask ROM.
Figure 2A:
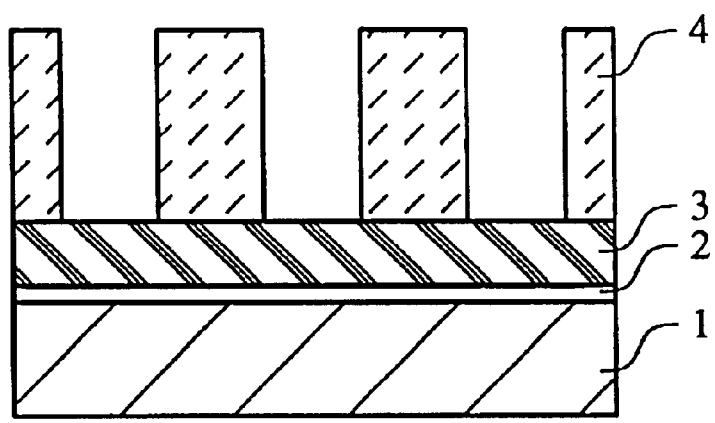
Figure 2B:
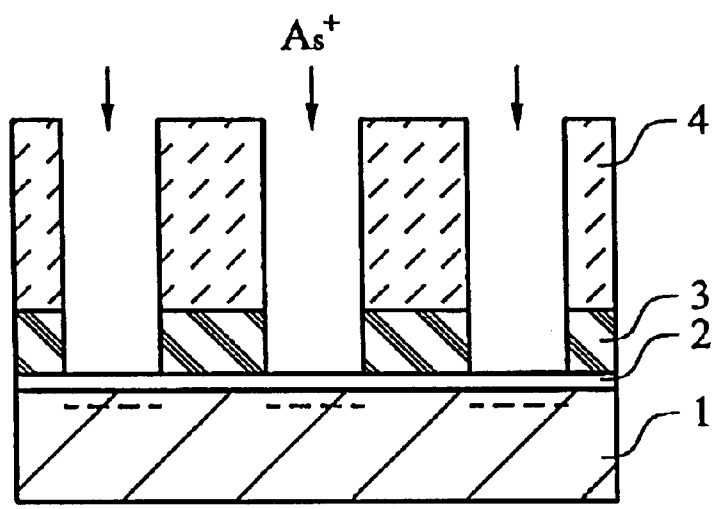
Figure 2C:
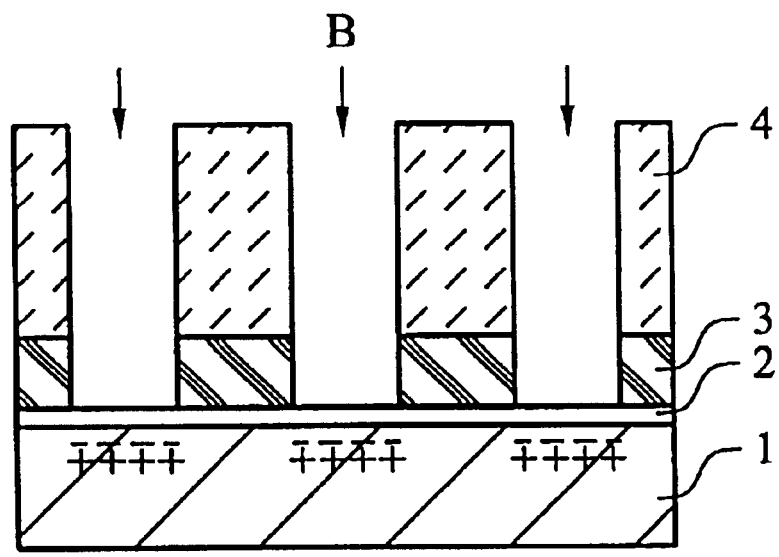
Figure 2D:
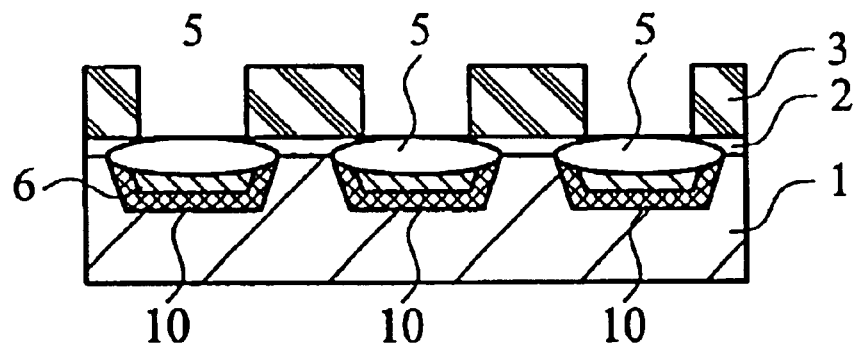
Figure 2E:
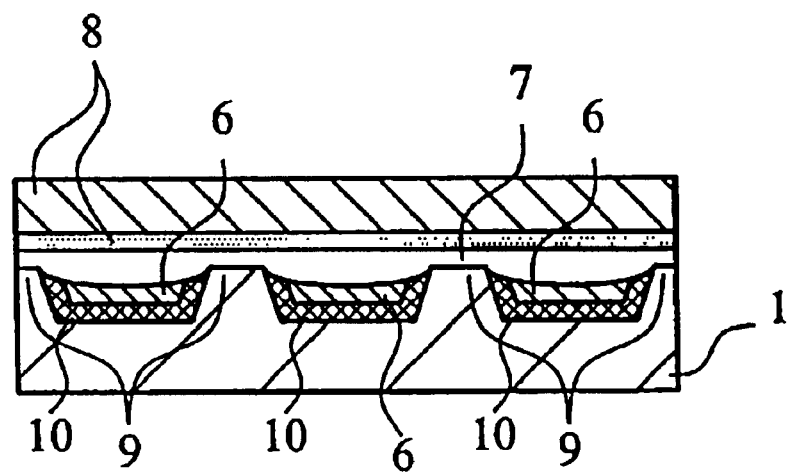
Figure 3:
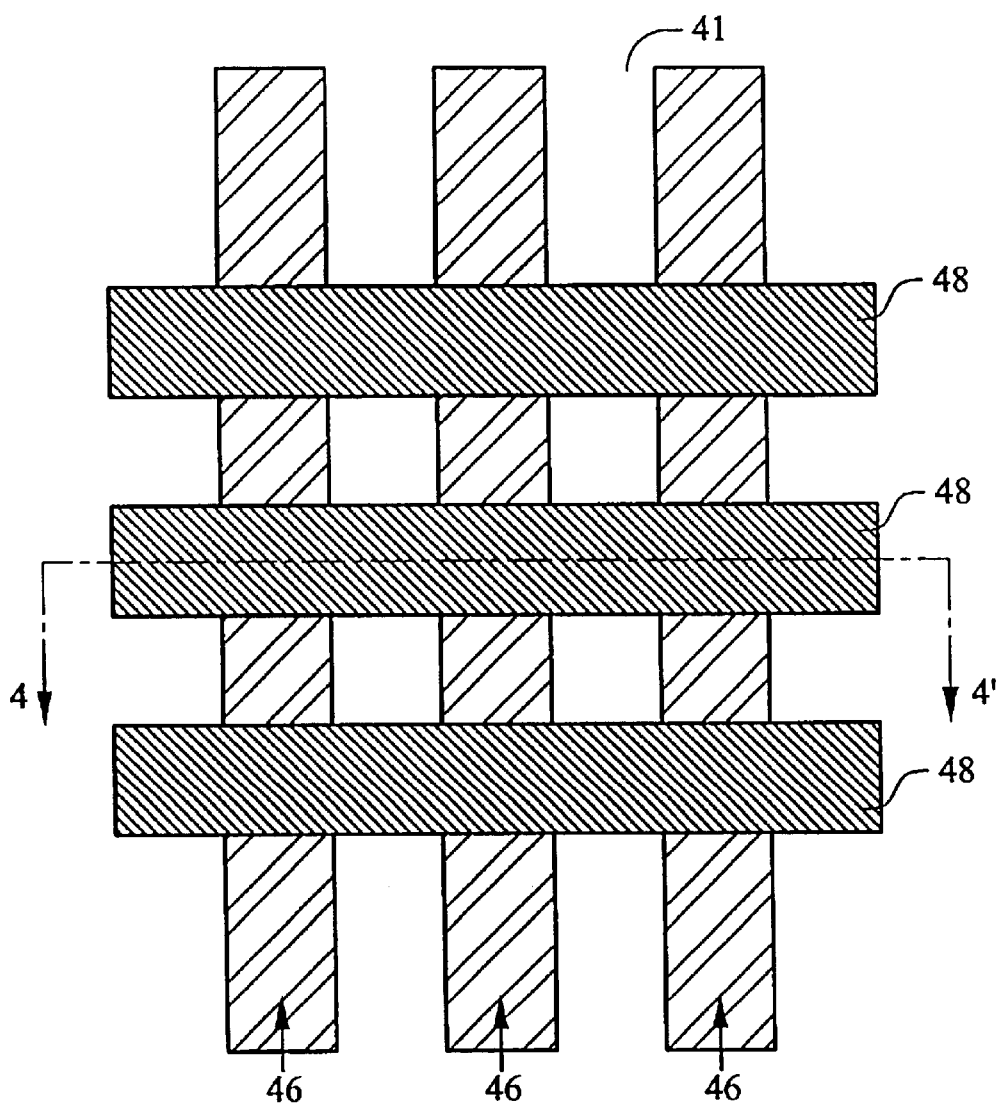
FIG. 3 is a top view of a mask ROM according to one embodiment of the present invention.

FIG. 3 shows the top view of a mask ROM according to one embodiment of the present invention. Bit lines 46 are formed in a silicon substrate 41 in a vertical direction, and word lines 48 are disposed above and extend orthogonal to the direction of the bit lines 46.

FIGS. 4A to 4E show cross-sectional views of the mask ROM taken during successive steps in fabrication process according to one embodiment in the present invention, wherein FIGS. 4A to 4E are cross-sectional views taken through the line 4-4' in FIG. 3.

Figure 4A:
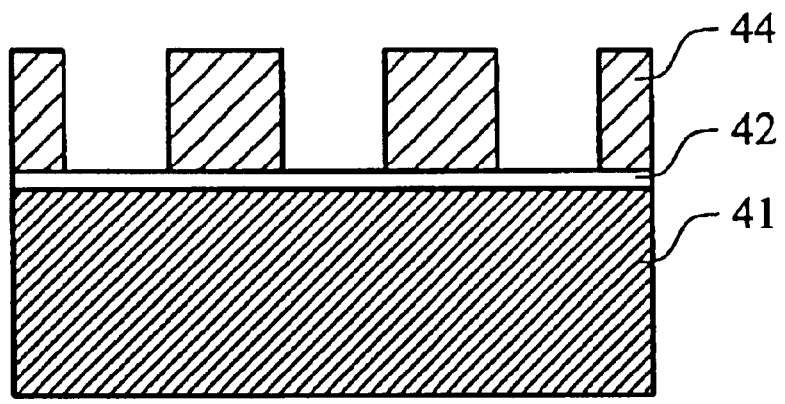

As shown in FIG. 4A, the surface of P-type silicon substrate 41 is subjected to oxidation to grow a pad oxide layer 42, such as silicon oxide, as a sacrificial oxide. A photoresist layer 44 is subsequently formed on the pad oxide layer 42. The photoresist layer 44 is patterned by photo-lithography to expose openings where diffusion regions of N conductivity will be formed to extend as bit lines 46 in the following steps.

In one preferred embodiment of the present invention, a bottom anti-reflective coating (BARC) layer (not shown) is formed between the pad oxide layer 42 and the photoresist layer 44 to absorb exposing energy and reduce multiple reflection and interference in photo-lithography.

Figure 4B:
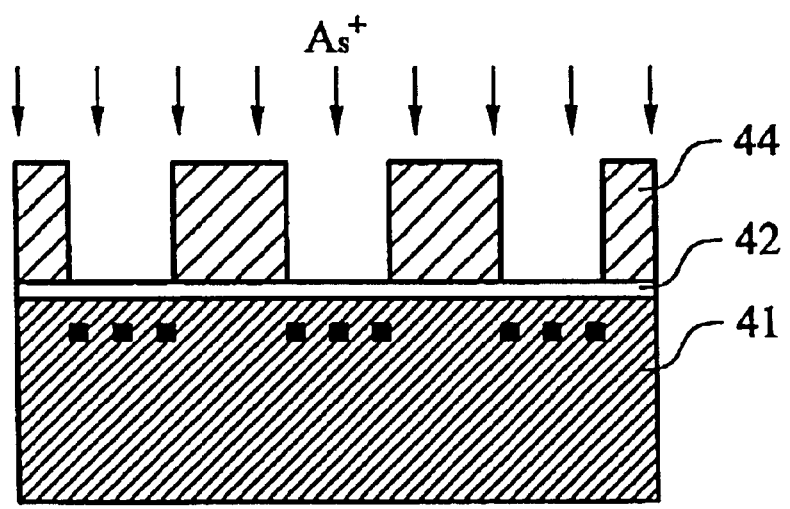

As shown in FIG. 4B, first type ions are implanted through the openings into the silicon substrate 41 using the photoresist layer 44 as a mask. In a preferred embodiment, the first type ions can be N-type ions, such as arsenic ion (As$^+$).

Figure 4C:
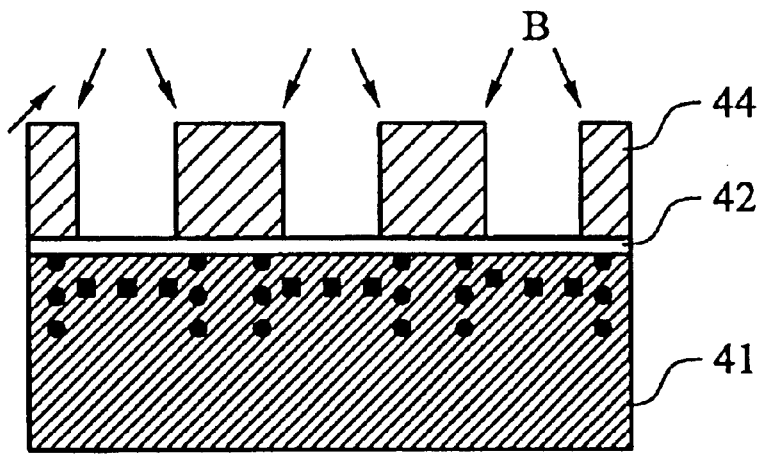

As shown in FIG. 4C, still using the photoresist layer 44 as a mask, second type ions that are electrically opposite to the first type ions are implanted through the openings into the silicon substrate 41. The implantation energy of the second type ions is set to be greater than the first type ions, and therefore, the vertical implanted depth of the second type ions in the silicon substrate 41 is deeper than the first type ions. In an preferred embodiment, the second type ions are P-type ions, such as boron (B), which are electrically opposite to N-type ions As$^+$.

The implantation of boron ions can be a pocket implantation as shown in FIG. 4C, wherein boron ions are implanted at an angle greater than 0 degree into the silicon substrate 41. The boron ions can also be implanted vertically (at a 0 degree angle) into the silicon substrate 41.

Figure 4D:
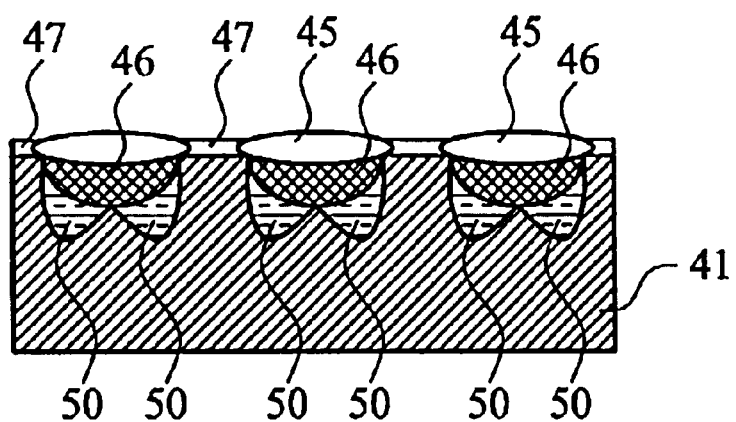

After the implantation is complete, the photoresist layer 44 and the pad oxide 42 are removed to expose the surface of the silicon substrate 41. The silicon substrate 41 is then subjected to oxidation to grow field oxide 45, gate oxide 47, N-type diffusion regions 46 and P-type diffusion regions 50 simultaneously, as FIG. 4D shows. Because the crystal lattice of the implanted regions has been amorphorized during implantation, field oxide 45 is formed due to the higher oxidation rate in the implanted region and gate oxide 47 is formed on non-implanted regions. Using the method, there is no need for forming an extra silicon nitride layer as a mask before oxidation to isolate active area.

Figure 4E:
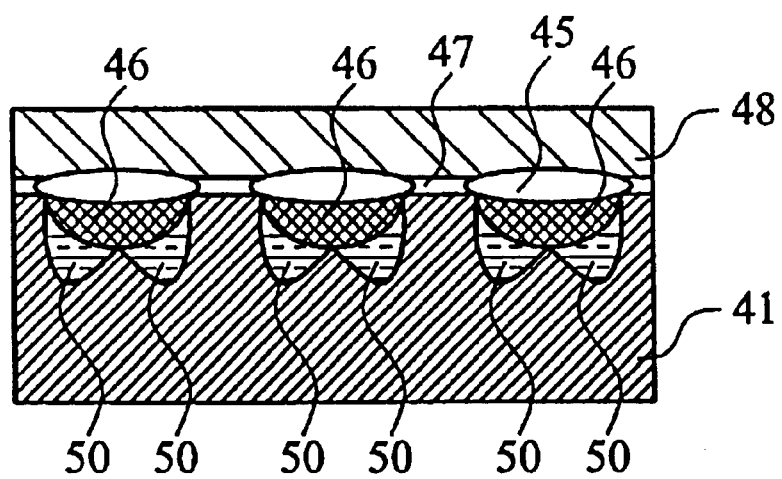

As shown in FIG. 4E, a gate conductive layer 48 is formed on the surface of silicon substrate 41. The gate conductive layer 48 is then patterned to define the world lines 48. In one preferred embodiment, the gate conductive layer 48 is poly-silicon gate.

One feature of the present invention is to use the pad oxide or the combination of pad oxide/BARC layer instead of the conventional combination of pad oxide/silicon nitride. Therefore, the steps of forming or removing the silicon nitride layer are omitted. Another feature of the present invention is to form the field oxide 45 and the gate oxide 47 simultaneously to simplify fabrication process of a mask ROM.

The advantage of the prevent invention is to simplify the fabrication process of a semiconductor memory device, especially a mask ROM. According to the present invention, there is no need to form the conventional silicon nitride as an oxidation mask. The gate oxide and the field oxide can be formed in one step oxidation because the crystal lattice of implanted regions is destroyed after implantation. The fabrication process can be simplified, and the cost and the fabrication time can be reduced according to the present invention.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method of fabricating a semiconductor memory device, comprising:

forming a sacrificial oxide layer on a semiconductor substrate;

forming a photoresist layer on the sacrificial oxide layer;

patterning the photoresist layer to form a plurality of openings where bit lines are to extend respectively;

implanting first type ions into the semiconductor substrate through the openings;

implanting second type ions into the semiconductor substrate through the openings, wherein the first type ions and the second type ions are electrically opposite and the implantation depth of the second type ions are deeper than the first type ions;

removing the photoresist layer and the sacrificial oxide layer;

growing a gate oxide and a field oxide simultaneously on the non-implanted and the implanted regions of the semiconductor layers respectively; and depositing a gate conductive layer on the semiconductor substrate.

2. The method as claimed in claim 1, further comprising the step of: forming a bottom anti-reflection layer between the sacrificial layer and the photoresist layer.

3. The method as claimed as in claim 1, wherein the sacrificial oxide layer is a pad oxide of silicon oxide.

4. The method as claimed as in claim 1, wherein the first type ion is N-type and the second type ions are P-type.

5. The method as claimed in claim 4, wherein the first type ions are arsenic (As) and the second type ion are boron (B).

6. The method as claimed in claim 1, wherein the second type ions are implanted at a 0 degree angle.

7. The method as claimed in claim 1, wherein the step of implanting the second type ions is performed by pocket implantation.

8. The method as claimed in claim 1, wherein the gate conductive layer is a poly-silicon layer.

9. A method of fabricating a mask ROM, comprising:

forming a sacrificial oxide layer and a bottom anti-reflection layer on a semiconductor substrate;

forming a photoresist layer on the bottom anti-reflection layer;

patterning the photoresist layer to form a plurality of openings where bit lines are to extend respectively;

implanting first type ions into the semiconductor substrate through the openings;

implanting second type ions into the semiconductor substrate through the openings, wherein the first type ions and the second type ions are electrically opposite and the implantation depth of the second type ions are deeper than the first type ions;

removing the photoresist layer, the bottom anti-reflection layer and the sacrificial oxide layer;

growing a gate oxide and a field oxide simultaneously on the non-implanted and the implanted regions of the semiconductor layers respectively; and depositing a gate conductive layer on the semiconductor substrate.

10. The method as claimed as in claim 9, wherein the sacrificial oxide layer is a pad oxide of silicon oxide.

11. The method as claimed as in claim 9, wherein the first type ions are N-type and the second type ions are P-type.

12. The method as claimed as in claim 11, wherein the first type ions are arsenic (As) and the second type ions are boron (B).

13. The method as claimed as in claim 9, wherein the second type ions are implanted at a 0 degree angle.

14. The method as claimed as in claim 9, wherein the step of implanting the second type ions is performed by pocket implantation.

15. The method as claimed as in claim 9, wherein the gate conductive layer is a poly-silicon layer.

* * * * *